(12) United States Patent
Yabuhana

(10) Patent No.: US 11,869,796 B2
(45) Date of Patent: Jan. 9, 2024

(54) ELECTRODE-EMBEDDED MEMBER AND METHOD FOR MANUFACTURING SAME, ELECTROSTATIC CHUCK, AND CERAMIC HEATER

(71) Applicant: NGK SPARK PLUG CO., LTD., Nagoya (JP)

(72) Inventor: Masaki Yabuhana, Nagoya (JP)

(73) Assignee: NITERRA CO., LTD., Nagoya (JP)

( * ) Notice: Subject to any disclaimer, the term of this patent is extended or adjusted under 35 U.S.C. 154(b) by 299 days.

(21) Appl. No.: 17/416,127

(22) PCT Filed: Mar. 19, 2020

(86) PCT No.: PCT/JP2020/012499
§ 371 (c)(1),
(2) Date: Jun. 18, 2021

(87) PCT Pub. No.: WO2020/196339
PCT Pub. Date: Oct. 1, 2020

(65) Prior Publication Data
US 2022/0102180 A1    Mar. 31, 2022

(30) Foreign Application Priority Data
Mar. 26, 2019    (JP) .................................. 2019-059113

(51) Int. Cl.
*H01L 21/683* (2006.01)
*H01L 21/67* (2006.01)
*H02N 13/00* (2006.01)

(52) U.S. Cl.
CPC .... *H01L 21/6833* (2013.01); *H01L 21/67103* (2013.01); *H02N 13/00* (2013.01)

(58) Field of Classification Search
CPC ................ C04B 35/581; C04B 35/645; H01L 21/67103; H01L 21/6833; H01L 21/68757;
(Continued)

(56) References Cited
U.S. PATENT DOCUMENTS 6,617,514 B1    9/2003    Ushikoshi et al.
8,908,349 B2    12/2014    Kida et al.
(Continued)

FOREIGN PATENT DOCUMENTS

JP    3776499 B2    5/2006
TW    2012-40014 A    10/2012

OTHER PUBLICATIONS

Taiwan Intellectual Property Office, Office Action (Notification for the Opinion of Examination) issued in corresponding Application No. 109109926 dated Feb. 23, 2022.
(Continued)

*Primary Examiner* — Sang Y Paik
(74) *Attorney, Agent, or Firm* — Stites & Harbison, PLLC; Jeffrey A. Haeberlin

(57) ABSTRACT

An electrode-embedded member 1 includes a ceramic-made substrate 2, an electrode 3, a connection member 4 containing at least one of tungsten and molybdenum and embedded in the substrate 2 in a state in which a first principal surface 4a faces the electrode 3 and is electrically connected to the electrode 3, and a hole portion 5 extending from an outer surface of the substrate 2 to a second principal surface 4b of the connection member 4. A buffer member 10 embedded in the substrate 2 contains at least a ceramic material forming the substrate 2 and a conductive material containing at least one of tungsten and molybdenum as a constituent element. The buffer member 10 covers at least part of an edge of the connection member 4.

11 Claims, 14 Drawing Sheets

(58) Field of Classification Search
CPC .... H01L 21/68785; H02N 13/00; H05B 3/02; H05B 3/12; H05B 3/74
USPC .................................................. 219/444.1
See application file for complete search history.

(56) References Cited

U.S. PATENT DOCUMENTS

| | | | |
|---|---|---|---|
| 2003/0080110 A1* | 5/2003 | Hiramatsu | H05B 3/265 |
| | | | 219/466.1 |
| 2003/0170415 A1* | 9/2003 | Hiramatsu | H01L 21/67109 |
| | | | 428/64.1 |
| 2006/0073349 A1* | 4/2006 | Aihara | C04B 37/005 |
| | | | 264/642 |
| 2010/0154203 A1* | 6/2010 | Lin | H05B 3/265 |
| | | | 29/621 |
| 2012/0250211 A1 | 10/2012 | Kida et al. | |

OTHER PUBLICATIONS

Japan Patent Office, International Search Report issued in corresponding Application No. PCT/JP2020/012499, dated Jun. 16, 2020.

\* cited by examiner

ELECTRODE-EMBEDDED MEMBER AND METHOD FOR MANUFACTURING SAME, ELECTROSTATIC CHUCK, AND CERAMIC HEATER

TECHNICAL FIELD

The present invention relates to an electrode-embedded member including a ceramic-made substrate and an electrode embedded therein, and to a method for manufacturing the same. The electrode-embedded member is used, for example, as a ceramic heater or an electrostatic chuck incorporated into a semiconductor manufacturing apparatus.

BACKGROUND ART

In one previously known electrode-embedded member, a metal electrode (internal electrode) is embedded in a plate-shaped substrate formed of a ceramic material such as aluminum nitride (AlN). In this electrode-embedded member, a hole (terminal hole) is formed in the ceramic substrate by machining such that the metal electrode inside the substrate is exposed in the hole. A circular-columnar metal terminal is inserted into the hole, and the forward end surface of the metal terminal is brazed to the metal electrode inside the substrate.

The electrode-embedded member is incorporated into, for example, a semiconductor manufacturing apparatus (such as an etching apparatus or a CVD apparatus) and used as an electrostatic chuck for a semiconductor wafer or for heating the semiconductor wafer. The electrode-embedded member may be exposed to high temperature repeatedly in use environment.

According to Japanese Patent No. 3776499, when a conventional electrode-embedded member is subjected to a thermal cycle test between room temperature and 600° C. and a long-term retention test at 600° C., cracking may occur on the inner surface of the substrate that defines the hole for the metal terminal. To address the occurrence of cracking, Japanese Patent No. 3776499 proposes a technique for reducing stress that remains in the substrate during manufacturing of the electrode-embedded member, thereby preventing the occurrence of cracking in the substrate.

CITATION LIST

Patent Literature

Patent Literature 1: Japanese Patent No. 3776499

SUMMARY OF INVENTION

Technical Problem

More detailed studies were conducted on the crack generated in the electrode-embedded member, and it was found that the generated crack extends from an edge of a connection member partially exposed at the bottom of the terminal hole to the interior of the substrate formed of, for example, aluminum nitride (AlN) and surrounding the connection member.

This will be described with reference to FIG. 7 showing, on an enlarged scale, a connection member of a conventional electrode-embedded member and its peripheral portions.

As shown in FIG. 7, the conventional electrode-embedded member 100 includes a substrate 101 formed of a ceramic such as aluminum nitride (AlN) and an internal electrode 102 embedded in the substrate 101, and a connection member 103 is disposed on the back surface side (the upper side in the figure) of the internal electrode 102. The connection member 103 is formed of a metal such as tungsten (W). A terminal hole 104 extending from the back surface side (the upper side in the figure) of the substrate 101 to the back surface of the connection member 103 is formed in the substrate 101. Part of a terminal 105 (external metallic terminal) is inserted into the terminal hole 104, and an end portion of the terminal 105 is connected to the connection member 103 through a brazing portion 106. The terminal 105 is formed of, for example, nickel (Ni). With the above structure, the terminal 105 is electrically connected to the internal electrode 102.

A front-surface-side portion (a lower side portion in the figure) of the ceramic-made substrate 101 of the electrode-embedded member 100 forms an insulating layer that electrically insulates the internal electrode 102 of the electrode-embedded member 100 from a semiconductor wafer to be placed on the electrode-embedded member 100 incorporated into, for example, a semiconductor manufacturing apparatus (such as an etching apparatus or a CVD apparatus).

One problem with the conventional electrode-embedded member 100 is that, during a process of manufacturing the electrode-embedded member 100 or when it is incorporated into, for example, a semiconductor manufacturing apparatus and used repeatedly at high temperature, a crack occurs inside the ceramic-made substrate 101.

As shown in FIG. 7, a crack 107 inside the substrate 101 typically starts from a point near an edge of the connection member 103 that is located on the back side (the upper side in the figure). In some cases, the crack 107 extends through the internal electrode 102 and reaches the front surface (the placement surface for a semiconductor wafer, etc.) of the substrate 101. The reason why the crack 107 tends to start from a point near the edge of the connection member 103 that is located on the back side (the upper side in the figure) may be that oxidation inside the electrode-embedded member 100 mainly proceeds not from the front surface side (the lower side in the figure) of the connection member 103 but from the back surface side (the upper side in the figure).

As described above, the front-surface-side portion of the substrate 101 of the electrode-embedded member 100 forms the insulating layer for electrical insulation between the internal electrode 102 of the electrode-embedded member 100 and a substrate to be treated, such as a semiconductor wafer, placed on the electrode-embedded member 100. It is therefore necessary to prevent the occurrence of a crack inside the substrate 101 of the electrode-embedded member 100, and it is particularly necessary to prevent the crack from extending through the insulating layer and reaching the placing surface for a substrate to be treated.

As for the cause of the occurrence of the crack, the influence of the difference in linear expansion coefficient (thermal expansion coefficient) between the terminal (external connection terminal) 105 made of nickel (Ni) and the connection member 103 made of tungsten (W) and embedded in the substrate 101 made of aluminum nitride (AlN) has been thought to be large. However, it has been found that, particularly in the case where the electrode-embedded member 100 is used for a long period of time, the influence of the difference in linear expansion coefficient between the embedded connection member 103 made of tungsten (W) and AlN therearound is large.

The present invention has been made in view of the foregoing circumstances, and it is an object to provide an electrode-embedded member which includes a ceramic-made substrate and an electrode embedded therein and in which the occurrence of a crack inside the substrate is suppressed or prevented and to provide a method for manufacturing the electrode-embedded member.

Solution to Problem

[1] In order to achieve the above-described object, an electrode-embedded member according to the present invention comprises:
- a ceramic-made substrate;
- an electrode embedded in the substrate;
- a connection member containing at least one of tungsten and molybdenum and having a first principal surface and a second principal surface, the connection member being embedded in the substrate in a state in which the first principal surface faces the electrode and the connection member is electrically connected to the electrode; and
- a hole portion extending from an outer surface of the substrate to the second principal surface of the connection member, the electrode-embedded member being characterized in that
a buffer member is embedded in the substrate,
the buffer member contains at least a ceramic material and at least one of tungsten and molybdenum, and
the buffer member covers at least part of an edge of the connection member.

In the electrode-embedded member of the present invention that has the above features, the value of the linear expansion coefficient (thermal expansion coefficient) of the mixed structure forming the buffer member is intermediate between the linear expansion coefficient of the material of the connection member and the linear expansion coefficient of the material of the substrate, and the change (difference) in linear expansion coefficient (thermal expansion coefficient) between the components is reduced. By virtue of this, stress concentrated on the edge of the connection member can be reduced, so that the occurrence of a crack propagating from the connection member to the substrate can be suppressed or prevented.

[2] In the electrode-embedded member of the present invention, preferably, the buffer member contains at least a ceramic material forming the substrate and a conductive material containing at least one of tungsten and molybdenum as a constituent element.

[3] Preferably, the electrode-embedded member of the present invention further comprises an external metallic terminal connected to the connection member with part of the external metallic terminal inserted into the hole portion.

By virtue of this, the internal electrode embedded in the substrate can be electrically connected to the outside through the external metallic terminal and the connection member.

[4] In the electrode-embedded member of the present invention, preferably, the connection member has a side surface that connects the first principal surface to the second principal surface and an edge formed by the first principal surface and the side surface, and the buffer member covers the entire circumference of the edge.

By virtue of this, the occurrence of a crack starting from the edge of the connection member can be reliably suppressed or prevented.

[5] In order to achieve the above-described object, an electrode-embedded member manufacturing method according to the present invention, which is used for manufacturing any of the above-described electrode-embedded members, comprises:
- a green body forming step of forming a ceramic-made first green body and a ceramic-made second green body;
- an electrode placing step of placing the electrode and the connection member on the first green body;
- a buffer member step of covering at least part of the edge of the connection member with the buffer member that is formed from a mixture of at least a ceramic material forming the first green body and the second green body and a conductive material containing at least one of tungsten and molybdenum as a constituent element;
- a second green body placing step of placing the second green body on the first green body, the electrode, the connection member, and the buffer member; and
- a sintering step of pressing and firing the first green body and the second green body with the electrode, the connection member, and the buffer member sandwiched between the first green body and the second green body.

With the electrode-embedded member manufacturing method of the present invention that has the above features, an electrode-embedded member in which the occurrence of a crack propagating from the connection member to the substrate can be suppressed or prevented can be manufactured. Specifically, the value of the linear expansion coefficient of the mixed structure forming the buffer member is intermediate between the linear expansion coefficient of the material of the connection member and the linear expansion coefficient of the material of the substrate, and the change (difference) in linear expansion coefficient between the components is reduced. By virtue of this, stress concentrated on the edge of the connection member can be reduced, so that the occurrence of a crack propagating from the connection member to the substrate can be suppressed or prevented.

[6] In order to achieve the above-described object, an electrode-embedded member manufacturing method according to the present invention, which is used for manufacturing any of the above-described electrode-embedded members, comprises:
- a first green compact forming step of forming a first green compact by charging a ceramic raw material powder into a closed-end cylindrical mold having an opening and pressing the ceramic raw material powder;
- an electrode placing step of disposing the electrode and the connection member in the closed-end cylindrical mold so as to be located on an opening side of the closed-end cylindrical mold with respect to the first green compact;
- a buffer member step of covering at least part of the edge of the connection member with the buffer member that is formed from a mixture of at least a ceramic material forming the raw material powder and a conductive material containing at least one of tungsten and molybdenum as a constituent element;
- a second green compact forming step of forming a second green compact including the first green compact by charging the raw material powder into the opening side of the closed-end cylindrical mold so as to be placed on the first green compact, the electrode, and the buffer member and then pressing the raw material powder; and
- a sintering step of pressing and firing the second green compact including, embedded therein, the electrode, the connection member, and the buffer member.

With the electrode-embedded member manufacturing method of the present invention that has the above features, an electrode-embedded member in which the occurrence of a crack propagating from the connection member to the substrate can be suppressed or prevented can be manufactured. Specifically, the value of the linear expansion coefficient of the mixed structure forming the buffer member is intermediate between the linear expansion coefficient of the material of the connection member and the linear expansion coefficient of the material of the substrate, and the change (difference) in linear expansion coefficient between the components is reduced. By virtue of this, stress concentrated on the edge of the connection member to can be reduced, so that the occurrence of a crack propagating from the connection member to the substrate can be suppressed or prevented.

DESCRIPTION OF EMBODIMENTS

An electrode-embedded member which is one embodiment of the present invention and methods for manufacturing the same will be described with reference to the drawings. The drawings schematically (conceptually) show an essential part of the electrode-embedded member, particularly, a connecting portion between an internal electrode and an external metallic terminal. The electrode-embedded member of the present embodiment is installed, for example, in a semiconductor manufacturing apparatus and used as a ceramic heater for heating a wafer for semiconductor production or an electrostatic chuck for attracting a wafer for semiconductor production by Johnsen-Rahbek force or Coulomb force.

Figure 1A:
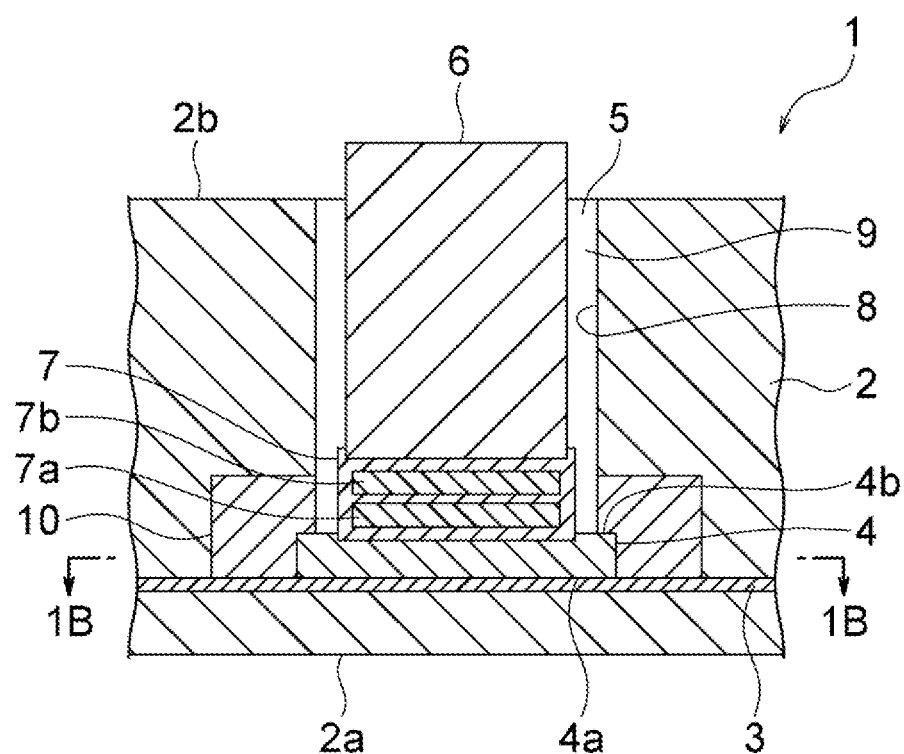
FIG. 1A is an explanatory view schematically showing an essential part of an electrode-embedded member which is one embodiment of the present invention.
Figure 1B:
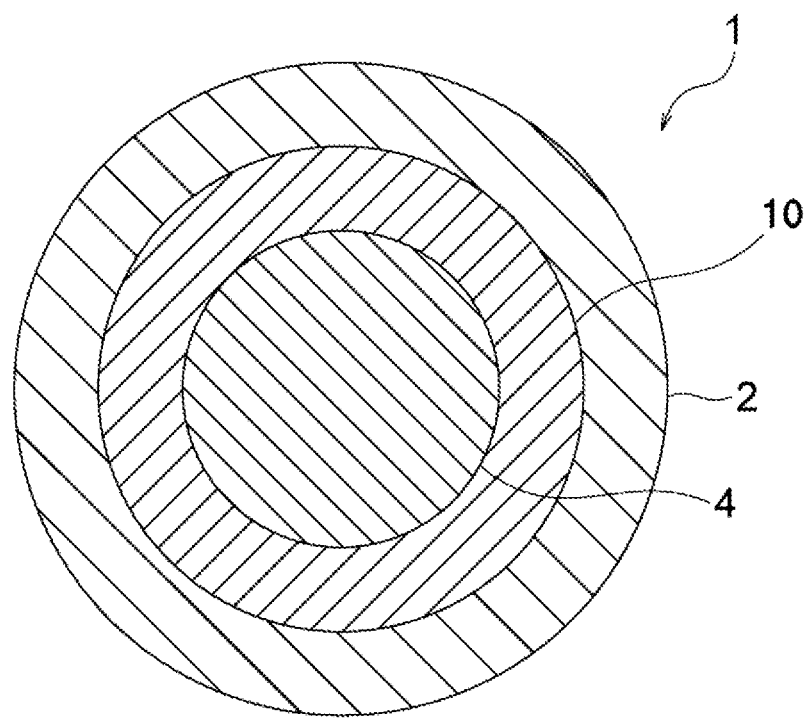
FIG. 1B is an explanatory view schematically showing the essential part of the electrode-embedded member which is the one embodiment of the present invention.

As shown in FIGS. 1A and 1B, the electrode-embedded member 1 of the present embodiment includes a plate-shaped substrate 2 made of a ceramic material and having a front surface 2a and a back surface 2b. An internal electrode 3 made of a metal material and extending parallel to the front surface 2a of the substrate 2 is embedded in the substrate 2. The ceramic material forming the substrate 2 is typically aluminum nitride (AlN), and other examples of the ceramic material include aluminum oxide ($Al_2O_3$). The metal material forming the internal electrode 3 is typically molybdenum (Mo), and other examples of the metal material include tungsten (W) and an alloy composed mainly of tungsten and/or molybdenum.

A disk-shaped connection member 4 extending along the front surface 2a of the substrate 2 is disposed on the back surface side of the internal electrode 3. The connection member 4 has a first principal surface 4a facing the internal electrode 3 and a second principal surface 4b opposite to the first principal surface 4a. The connection member 4 is electrically connected to the internal electrode 3. The same metal material as that forming the internal electrode 3 described above can be used as the material forming the connection member 4. However, it is not always necessary that the material of the connection member 4 be the same as the material of the internal electrode 3. Specifically, it is only necessary that the material forming the connection member 4 contain at least one of tungsten and molybdenum.

A terminal hole (hole portion) 5 is drilled in the substrate 2 so as to extend from the back surface (outer surface) 2b to the second principal surface 4b of the connection member 4 inside the substrate 2. Part of a circular-columnar terminal 6 is inserted into the terminal hole 5, and an end portion of the terminal 6 is connected to the connection member 4 through a brazing portion 7. The brazing portion 7 includes an intermediate member 7a made of tungsten (W) and an intermediate member 7b made of Kovar that are embedded in a brazing material such as gold solder typified by Au—Ni-based solder or silver solder typified by Ag—Cu-based solder. The diameter of the terminal hole 5 is, for example, 5 mm. The terminal 6 has, for example, a diameter of 4.8 mm and a length of 20 mm. A gap 9 is formed between the terminal 6 and an inner surface 8 of the substrate 2 that defines the terminal hole 5. The width of the gap 9 is, for example, 0.1 mm. The metal material forming the terminal (external metallic terminal) 6 is typically nickel, and other examples of the metal material include low-thermal expansion metal alloys such as Kovar, titanium, copper, and alloys composed mainly of any of them.

In the present embodiment, the circular-columnar terminal 6 and the disk-shaped connection member 4 disposed concentrically with each other are connected to each other. However, it is not always necessary that the terminal 6 and the connection member 4 be disposed concentrically with each other, and they may be misaligned from each other. The shape of the terminal 6 may be a rod-like shape other than the circular-columnar shape. The brazing portion 7 may be in contact with a surrounding member (e.g., a buffer member 10).

With the structure described above, the terminal (external metallic terminal) 6 is electrically connected to the internal electrode 3 embedded in the substrate 2. The shape of the connection member 4 is not always limited to the disk shape, and any shape suitable for electrically connecting the internal electrode 3 to the terminal 6 can be appropriately selected. In order to secure electrical connection between the internal electrode 3 and the connection member 4, they may be brought into direct contact with each other, or they may be bonded together using an electrically conductive paste.

In the electrode-embedded member 1 of the present embodiment, the buffer member 10 covering at least part of an edge of the connection member 4 is embedded in the substrate 2. The buffer member 10 contains at least the ceramic material forming the substrate 2 and a conductive material containing at least one of tungsten and molybdenum as a constituent element.

It is not always necessary that the conductive material included in the buffer member 10 be the same as the material forming the connection member 4. For example, when the connection member 4 is made of molybdenum, the conductive material included in the buffer member 10 may be molybdenum or may be tungsten.

The conductive material included in the buffer member 10 may be tungsten carbide or molybdenum carbide. In other words, it is only necessary that the conductive material included in the buffer member 10 be a material containing at least one of tungsten or molybdenum as a constituent element.

Figure 2:
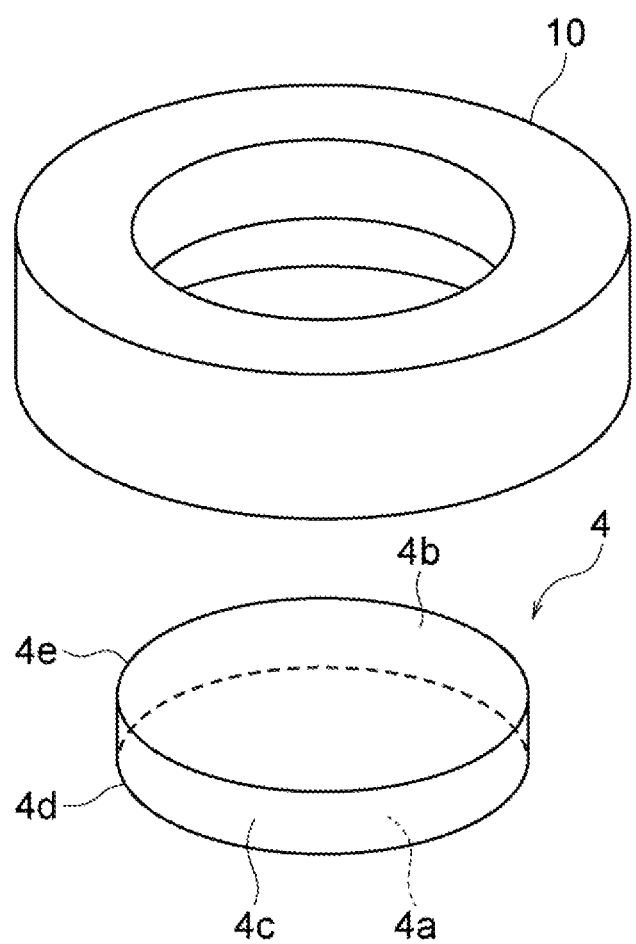
FIG. 2 is an explanatory view showing, on an enlarged scale, a connection member and a buffer member of the electrode-embedded member shown in FIGS. 1A and 1B in a state in which the connection member and the buffer member are separated from each other.

As shown in FIG. 2, the connection member 4 of the present embodiment has a side surface 4c connecting the first principal surface 4a to the second principal surface 4b and edges 4d and 4e formed by the side surface 4c and the principal surfaces 4a and 4b, respectively. In the present embodiment, the buffer member 10 covers the entire circumference of the edge 4e of the disc-shaped connection member 4 that is on the second principal surface 4b side.

Next, methods for manufacturing the electrode-embedded member 1 shown in FIGS. 1A and 1B will be described with reference to the drawings. The methods for manufacturing the electrode-embedded member 1 are broadly classified into a method using a green body pressing method and a method using a powder hot-pressing method.

First, the method for manufacturing the electrode-embedded member 1 using the green body pressing method will be described. Green bodies processed in the green body pressing method include debindered green bodies and calcined green bodies.

This manufacturing method includes: a green body forming step of forming a ceramic-made first green body and a ceramic-made second green body; an electrode placing step of placing the internal electrode 3 and the connection member 4 on the first green body; a buffer member step of covering at least part of the edges 4d and 4e of the connection member 4 with the buffer member 10; a second green body placing step of placing the second green body on the first green body, the internal electrode 3, the connection member 4, and the buffer member 10; and a sintering step of pressing and sintering the first green body and the second green body with the electrode 3, the connection member 4, and the buffer member 10 sandwiched between the first green body and the second green body.

The buffer member 10 in the buffer member step is formed from a mixture of at least the ceramic material forming the first and second green bodies and a conductive material containing at least one of tungsten and molybdenum as a constituent element. The buffer member 10 can be formed using, for example, a material mixture composed mainly of tungsten (or molybdenum) and aluminum nitride (AlN) with a sintering aid such as $Y_2O_3$ optionally added thereto.

Specific combinations (compositional ratios, etc.) of the materials used as the material mixture forming the buffer member 10 are as follows.

(1) 50 vol % of a powder mixture prepared by mixing 5 wt % of $Y_2O_3$ with AlN and 50 vol % of tungsten powder (2) 30 vol % of the powder mixture prepared by mixing 5 wt % of $Y_2O_3$ with AlN and 70 vol % of the tungsten powder (3) 90 vol % of the powder mixture prepared by mixing 5 wt % of $Y_2O_3$ with AlN and 10 vol % of the tungsten powder (4) 70 vol % of the powder mixture prepared by mixing 5 wt % of $Y_2O_3$ with AlN and 30 vol % of molybdenum powder If the amount of AlN exceeds 90 vol %, the linear expansion coefficient of the buffer member 10 is too close to the linear expansion coefficient of the material of the substrate 2, so that the change (difference) in linear expansion coefficient between the connection member 4 and the substrate 2 is not sufficiently reduced. Therefore, stress concentrated on the edges of the connection member 4 cannot be reduced, and the occurrence of a crack propagating from the connection member 4 to the substrate 2 may not be suppressed or prevented.

If the amount of AlN is less than 30 vol %, the linear expansion coefficient of the buffer member 10 is too close to the linear expansion coefficient of the material of the connection member 4, so that the change (difference) in linear expansion coefficient between the connection member 4 and the substrate 2 is not sufficiently reduced. Therefore, there is a possibility that stress concentrated on the edges of the connection member 4 cannot be reduced, and the occurrence of a crack propagating from the connection member 4 to the substrate 2 can not be suppressed or prevented.

A more specific method for manufacturing the electrode-embedded member 1 will be described with reference to FIGS. 3A to 4B.

(1) Step of preparing plurality of AlN green bodies

Step of cutting green bodies from a CIP product or the like using a conventional method and processing the green bodies into prescribed shapes In this step,
  i) the first green body (a plate that becomes the insulating layer after firing) and
  ii) the second green body (a plate that becomes a base after firing) are produced.

(2) Step of debindering the first and second AlN green bodies to produce a first debindered green body 20 and a second debindered green body 21

(3) Step of placing the internal electrode 3 on the first debindered green body 20 and placing the connection member 4 on the internal electrode 3

(4) Step of producing a green body using a powder mixture of AlN raw material powder and powder of the metal forming connection member 4, shaping the green body into the buffer member 10 having a shape for covering the connection member 4, and laying the buffer member 10 on the connection member 4

Figure 3A:
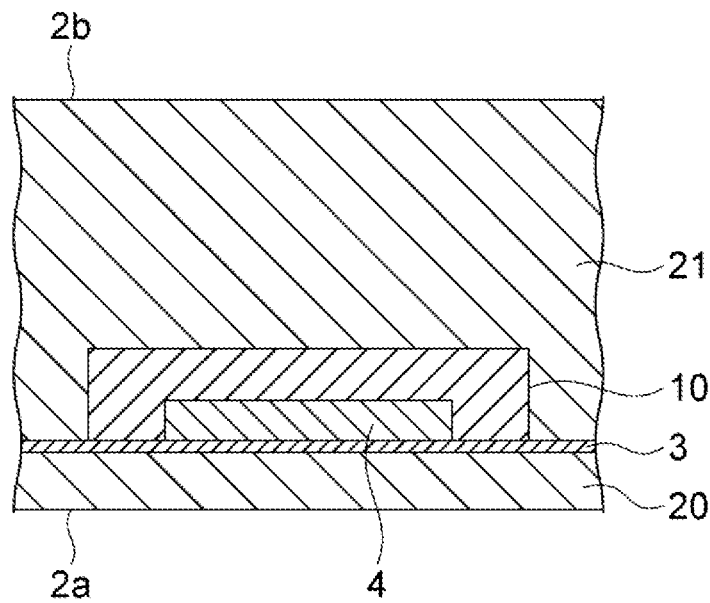
FIG. 3A is an explanatory view showing a method for manufacturing the electrode-embedded member which is the one embodiment of the present invention.
Figure 3B:
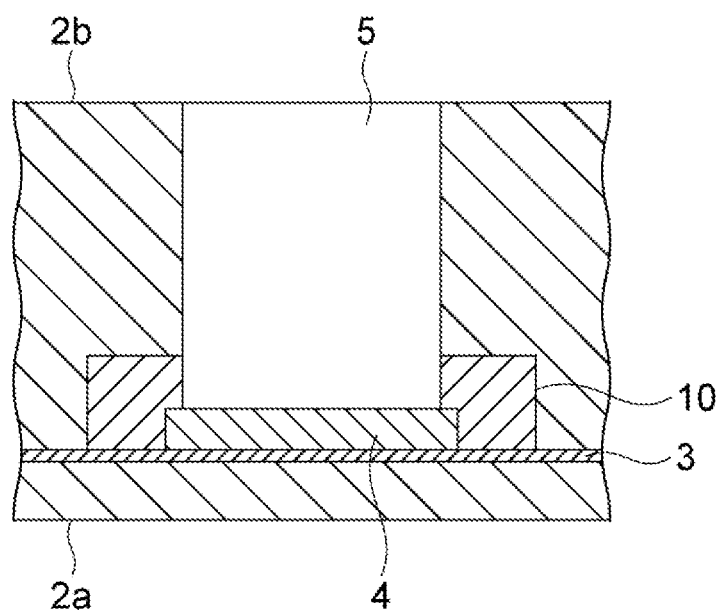
FIG. 3B is an explanatory view showing the method for manufacturing the electrode-embedded member which is the one embodiment of the present invention.

(5) Step of placing the second debindered green body 21 on the buffer member 10 and performing uniaxial press firing (hot pressing) (FIG. 3A)

In this step, the first debindered green body 20 and the second debindered green body 21 are sintered, and the internal electrode 3, the connection member 4, and the buffer member 10 are integrated as a result of sintering.

(6) Step of drilling the sintered body from one side (back surface 2b) to form the terminal hole 5 to thereby expose the embedded connection member 4 (FIG. 3B) More preferably, the diameter of the terminal hole 5 is smaller than the representative dimension (e.g., the diameter) of the connection member 4.

Figure 4A:
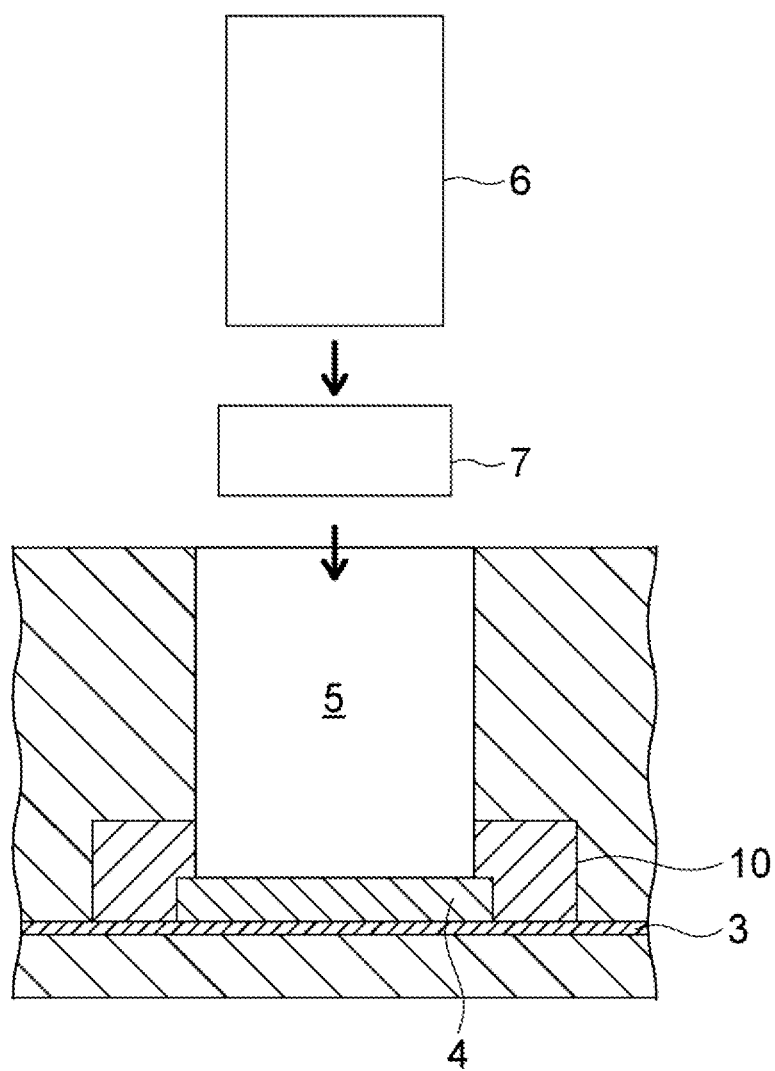
FIG. 4A is another explanatory view showing the method for manufacturing the electrode-embedded member which is the one embodiment of the present invention.
Figure 4B:
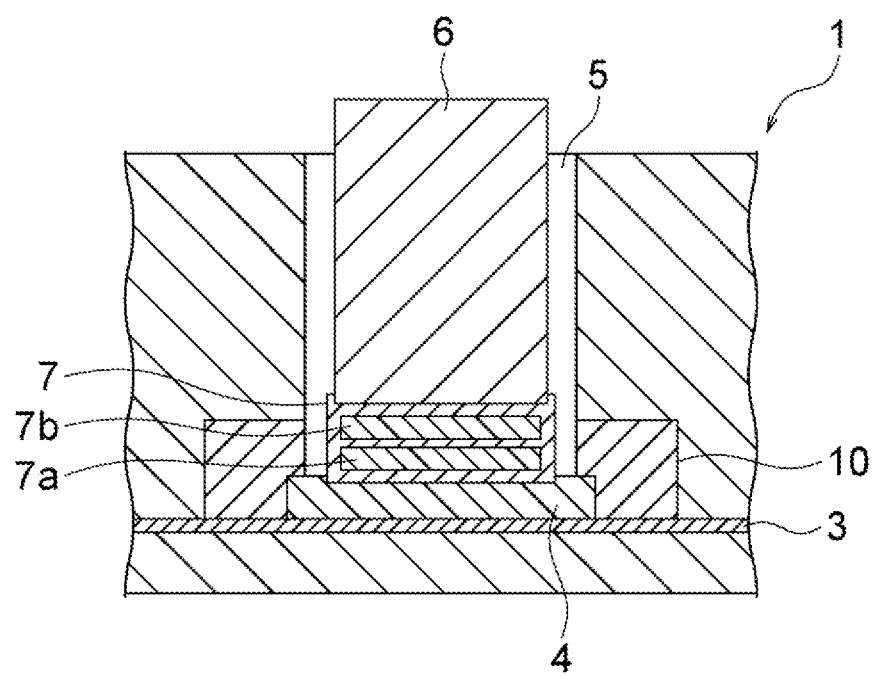
FIG. 4B is another explanatory view showing the method for manufacturing the electrode-embedded member which is the one embodiment of the present invention.

(7) Step of brazing the terminal (external connection terminal) 6 to the connection member 4 with a brazing material (brazing portion) (FIGS. 4A and 4B)

The electrode-embedded member 1 shown in FIGS. 1A and 1B is manufactured through the above series of steps (1) to (7).

The number of internal electrodes 3 embedded in the substrate 2 of the electrode-embedded member 1 is not limited to one, and a plurality of internal electrodes 3 may be embedded in the substrate 2. In this case, the plurality of internal electrodes 3 may be embedded at different positions in the thickness direction of the substrate 2. For example, a substrate 2 including two internal electrodes 3 embedded therein can be produced as follows. In step (5) described above, an additional internal electrode 3 is placed on the second debindered green body 21, and an additional connection member 4 and an additional buffer member 10 are placed at respective prescribed positions on the additional internal electrode 3. Subsequently, a debindered AlN green body prepared separately is placed thereon, and the resulting product is subjected to uniaxial press firing (hot pressing).

Next, the method for manufacturing the electrode-embedded member 1 using the powder hot-pressing method will be described.

The manufacturing method includes: a first green compact forming step of forming a first green compact by charging a ceramic-made raw material powder into a closed-end cylindrical mold having an opening and pressing the powder; an electrode placing step of disposing the internal electrode 3 and the connection member 4 in the closed-end cylindrical mold as to be located on the opening side of the closed-end cylindrical mold with respect to the first green compact; a buffer member step of covering at least part of the edges 4d and 4e of the connection member 4 with the buffer member 10; a second green compact forming step of forming a second green compact including the first green compact by charging the raw material powder into the opening side of the closed-end cylindrical mold so as to be placed on the first green compact, the internal electrode 3, and the buffer member 10 and pressing the raw material powder; and a sintering step of pressing and firing the second green compact including, embedded therein, the internal electrode 3, the connection member 4, and the buffer member 10.

In this manufacturing method also, the buffer member 10 in the buffer member step is formed from a mixture of at least the ceramic material forming the first and second green bodies and a conductive material containing at least one of tungsten and molybdenum as a constituent element.

When the powder hot-pressing method is used to embed two internal electrodes 3 at different positions in the thickness direction of the substrate 2, an additional internal electrode 3 is placed on the second green compact, and an additional connection member 4 and an additional buffer member 10 are disposed at respective prescribed positions on the additional internal electrode 3. Subsequently, the raw material powder is charged into the opening side of the closed-end cylindrical mold and pressed to thereby produce a third green compact including, embedded therein, the second green compact, the additional internal electrode 3, the additional connection member 4, and the additional buffer member 10. Subsequently, a sintering step is performed to press and fire the third green compact.

In the above, the electrode-embedded member which is the embodiment of the present invention and the methods for manufacturing the electrode-embedded member have been described. With the above embodiment, the following specific operational advantages can be obtained.

In the above embodiment, the buffer member 10 is disposed around the connection member 4, particularly over the entire circumference of the edge 4e on the second principal surface 4b side. The buffer member 10 has a mixed structure containing at least the ceramic material forming the substrate 2 and the conductive material containing at least one of tungsten and molybdenum as a constituent element. Therefore, the value of the linear expansion coefficient of the mixed structure forming the buffer member 10 is intermediate between the linear expansion coefficient of the material of the connection member 4 and the linear expansion coefficient of the material (a ceramic material such as AlN) of the substrate 2, so that the change (difference) in linear expansion coefficient between the components is reduced. By virtue of this, stress concentrated on the edge of the connection member 4 can be reduced, so that the occurrence of a crack propagating from the edge of the connection member 4 to the substrate 2 can be suppressed or prevented.

In the present embodiment, the buffer member 10 disposed around the connection member 4 contains at least the ceramic material forming the substrate 2 and the conductive material containing at least one of tungsten and molybdenum as a constituent material (e.g., a mixed structure of tungsten (W)—AlN). In this case, the amount of fine irregularities generated at the interface between the buffer member 10 and the substrate 2 during the firing process, etc. increases. Therefore, a good joint state is maintained between the buffer member 10 and the substrate 2, and the progress of oxidation inside the electrode-embedded member 1 can be prevented.

Figure 5A:
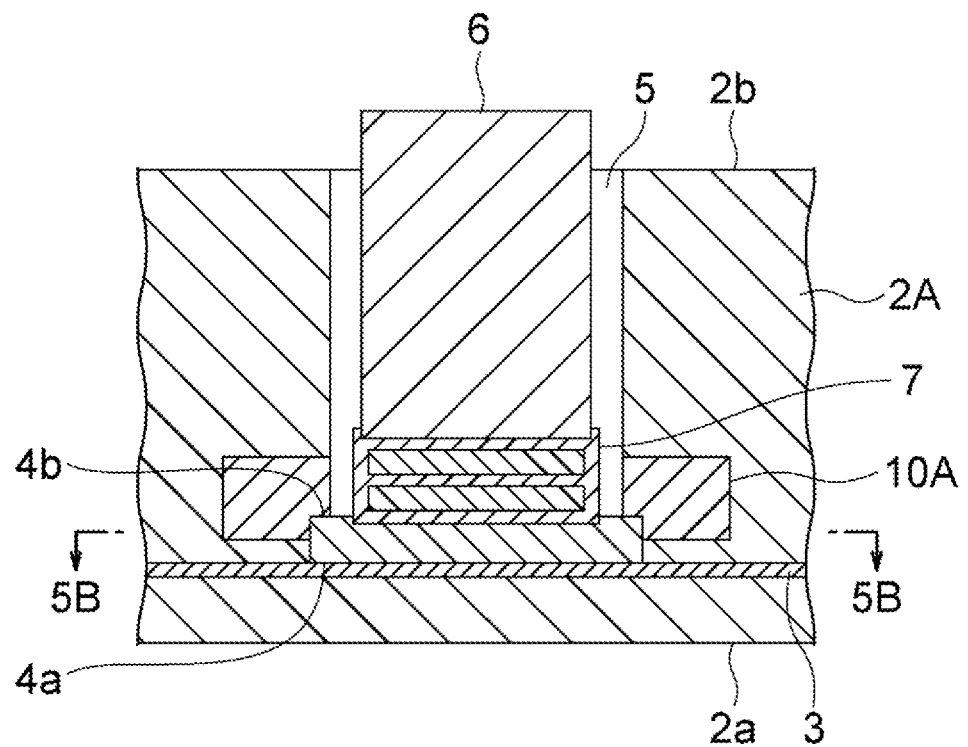
FIG. 5A is an explanatory view schematically showing an essential part of an electrode-embedded member which is another embodiment of the present invention.
Figure 5B:
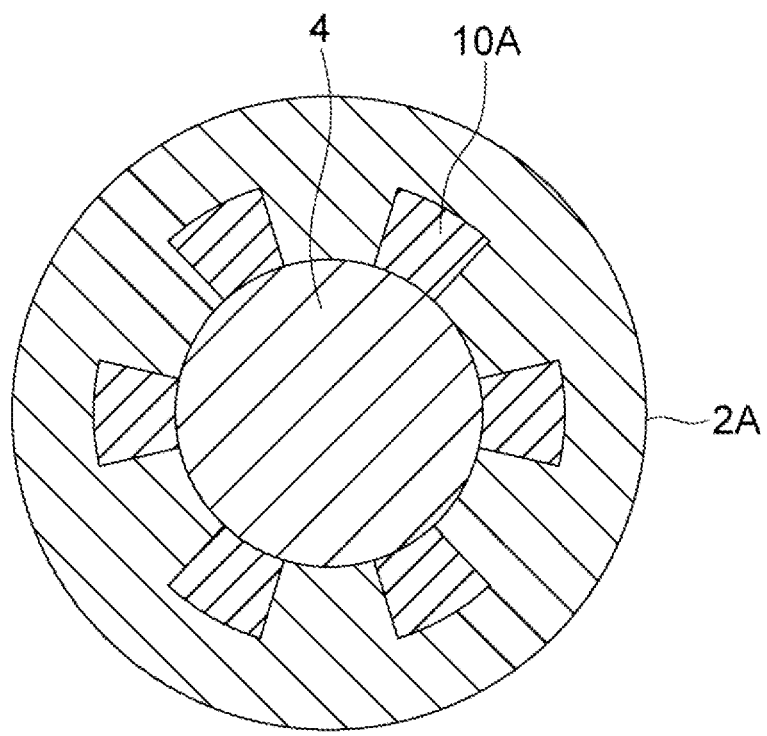
FIG. 5B is an explanatory view schematically showing the essential part of the electrode-embedded member which is the another embodiment of the present invention.

Next, an electrode-embedded member according to another embodiment of the present invention will be described with reference to FIGS. 5A and 5B. In FIGS. 5A and 5B, portions having structures in common with the embodiment shown in FIG. 1A, etc. are denoted by the same symbols, and portions different from those in the above embodiment will be described.

In the embodiment shown in FIG. 1A, etc., an end surface of the buffer member 10 that is located on the internal electrode 3 side (the surface electrically connected to the internal electrode 3) has an annular shape extending around the connection member 4, and the entire annular end surface of the buffer member 10 is electrically connected to the back surface of the internal electrode 3.

In contrast, in the embodiment shown in FIGS. 5A and 5B, an end surface of a buffer member 10A that is located on the internal electrode 3 side (the surface electrically connected to the internal electrode 3) does not extend annularly (continuously) around the connection member 4 but is formed intermittently (discontinuously) in the circumferential direction. Specifically, the electrical connection state between the buffer member 10A and the internal electrode 3 is intermittent (discontinuous) in the circumferential direction. In other words, in the embodiment shown in FIGS. 5A and 5B, part of a ceramic-made substrate 2A is locally interposed between the buffer member 10A and the internal electrode 3.

In the embodiment shown in FIGS. 5A and 5B, as in the embodiment shown in FIG. 1A, etc., the entire circumference of the edge 4e of the connection member 4 that is located on the second principal surface 4b side can be covered. Therefore, stress concentrated around the edge 4e of the connection member 4 is reduced, and the occurrence of a crack can be suppressed or prevented.

Figure 6:
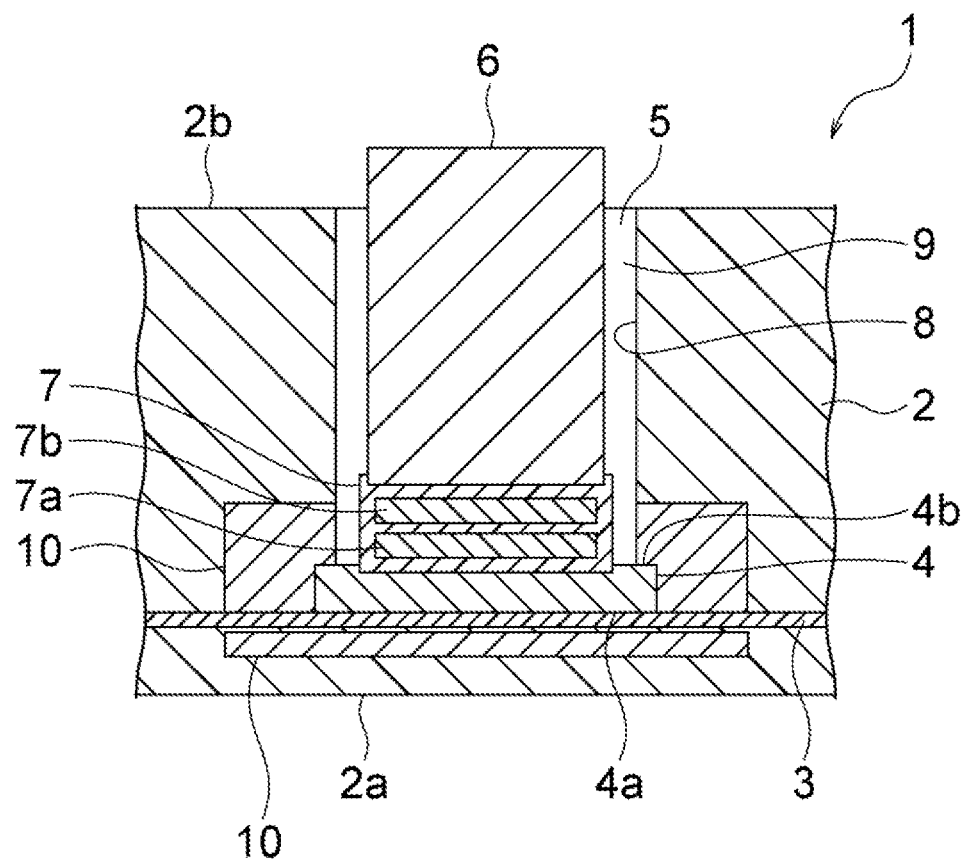
FIG. 6 is an explanatory view schematically showing an essential part of an electrode-embedded member which is still another embodiment of the present invention.
Figure 7:
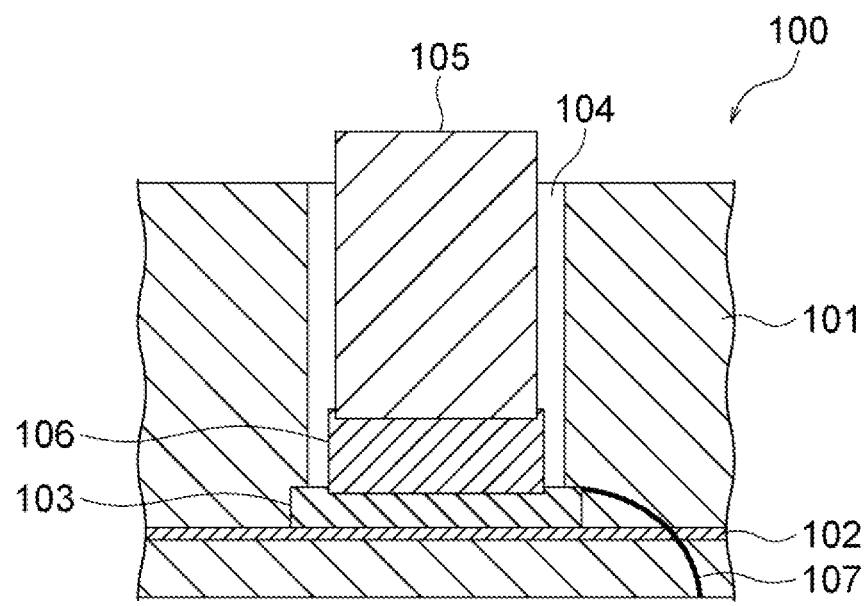
FIG. 7 is an explanatory view schematically showing an essential part of a conventional electrode-embedded member.

In still another embodiment, an additional buffer member may be disposed at a prescribed position on the first debindered green body or the first green compact. In this case, as shown in FIG. 6, in addition to the buffer member disposed around the edge 4e of the connection member 4 that is located on the second principal surface 4b side, the additional buffer member is disposed around the edge 4d of the connection member 4 that is located on the first principal surface 4a side. In this manner, the occurrence of a crack can be suppressed or prevented around both the edges 4d and 4e of the connection member 4.

The present invention is suitable for an electrode-embedded member 1 in which the internal electrode 3 used as a high-frequency electrode, a ground electrode, or an electrostatic attraction electrode is embedded at a position close to the front surface 2a of the substrate 2. Moreover, the present invention is suitable for an electrode-embedded member 1 in which, in addition to the internal electrode 3 embedded at the position close to the front surface 2a of the substrate, an additional internal electrode 3 used as a heater electrode is embedded so that the electrode-embedded member 1 can be self-heated. In electrode-embedded members 1 disclosed in the following Examples, two internal electrodes 3 used as a high-frequency electrode and a heater electrode are embedded in the substrate 2 for the purpose of suppressing the occurrence of a crack inside the substrate 2 during use at high temperature.

EXAMPLES

FIGS. 1A to 4B describe the structures of the internal electrode 3 used as a high-frequency electrode embedded at a position close to the front surface 2a of the substrate, the connection member 4, and the buffer member 10 and the steps of embedding these members. The structure of an additional internal electrode 3 used as the heater electrode and the steps of embedding the additional internal electrode 3, an additional connection member 4, and an additional buffer member 10 that are provided for the additional internal electrode 3 are similar to the structure of the internal electrode 3 used as the high-frequency electrode and the steps of embedding this internal electrode 3 and are therefore not illustrated. Various Examples of the method for manufacturing the electrode-embedded member 1 including the two internal electrodes 3 embedded therein and serving as the high-frequency electrode and the heater electrode will be described.

The debindering, firing, and brazing conditions in the following Examples conform to those of conventional ceramic sintered body manufacturing methods, and the conditions may be appropriately changed.

Example 1

An example in which an electrode-embedded member 1 was manufactured using the compact pressing method will be described as Example 1.

(1) A binder was added to a powder mixture containing 95% by mass of aluminum nitride powder and 5% by mass of yttrium oxide powder, and the resulting mixture was granulated. Then, the granulated mixture was subjected to CIP molding (pressure: 1 ton/cm$^2$) to obtain a green body ingot. The ingot was machined to produce the following green bodies.

(i) Disk-Shaped Green Body a (a Plate that Becomes the Insulating Layer after Firing)

Diameter: 340 mm, thickness: 5 mm (ii) Disk-Shaped Green Body B (a Plate that Becomes an Intermediate Base after Firing)

Diameter: 340 mm, thickness: 10 mm

A recess having a diameter of 300 mm and a depth of 0.1 mm and used to receive a first internal electrode 3 (the high-frequency electrode) was formed on one side of the disk-shaped green body B such that the center of the recess coincided with the center of the green body.

Moreover, a recess having a diameter of 12 mm and a depth of 1.5 mm and used to receive a connection member 4 and a buffer member 10 was formed at a prescribed position at which the terminal was to be formed.

(iii) Disk-Shaped Green Body C (a Plate that Becomes a Base after Firing)

Diameter: 340 mm, thickness: 20 mm

A recess having a diameter of 300 mm and a depth of 0.1 mm and used to receive a second internal electrode 3 (the heater electrode) was formed on one side of the disk-shaped green body C such that the center of the recess coincided with the center of the green body.

Moreover, a recess having a diameter of 12 mm and a depth of 1.5 mm and used to receive an additional connection member 4 and an additional buffer member 10 was formed at a prescribed position at which the terminal was to be formed.

(2) The disk-shaped green bodies A, B, and C were debindered to produce disk-shaped debindered green bodies A, B, and C.

The debindering was performed at 500° C. or higher in an air atmosphere.

(3) The first internal electrode 3, the connection member 4, and the buffer member 10 were placed inside the disk-shaped debindered green body B, and the second internal electrode 3, the additional connection member 4, and the additional buffer member 10 were placed inside the disk-shaped debindered green body C.

(iv) Heater Electrode and High-Frequency Electrode

Molybdenum wire mesh (wire diameter: 0.1 mm, plain weave, mesh size: #50)

The mesh was cut into a prescribed shape to prepare the heater electrode. The outermost diameter was 294 mm.

The molybdenum wire mesh was cut into a circular shape to prepare the high-frequency electrode. The outermost diameter was 298 mm.

(v) Connection Members

Tungsten bulk bodies with a diameter of 8 mm and a thickness of 0.5 mm were prepared.

(vi) Buffer Members

AlN raw material powder and W powder were mixed at a volume ratio of 50%:50% and then molded to produce recessed disks each having a diameter of 12 mm and a thickness of 1.5 mm. Each recessed disk had a counterbore hole (recess) extending inward from one side of the disk and having a diameter of 8 mm and a depth of 0.5 mm.

(vii) Placement of Heater Electrode, Etc.

The additional buffer member was placed in the 12 mm diameter recess of the disk-shaped debindered green body C such that the counterbore hole faced upward.

The additional connection member was fitted into the counterbore hole of the additional buffer member.

Further, the heater electrode (the second internal electrode) was fitted into the 300 mm diameter recess of the debindered green body C.

(viii) Placement of Disk-Shaped Debindered Green Body B

The disk-shaped debindered green body B was stacked on the disk-shaped debindered green body C such that the disk-shaped debindered green body B was on the side on which the heater electrode was embedded.

(ix) Placement of High-Frequency Electrode, Etc.

The buffer member was placed in the 12 mm diameter recess of the disk-shaped debindered green body B such that the counterbore hole faced upward.

The connection member was fitted into the counterbore hole of the buffer member.

Further, the high-frequency electrode (the first internal electrode) was fitted into the 300 mm diameter recess of the disk-shaped debindered green body B.

The disk-shaped debindered green body A was stacked thereon, and a stacked body (debindered green body) was thereby completed.

(4) The debindered green body was transferred to a carbon mold. The carbon mold was placed in a hot press furnace, and the debindered green body was hot press fired.

The hot press firing was performed at a pressure of 10 MPa and a firing temperature of 1800° C. for a firing time of 2 hours.

(5) Post-Firing Machining

Subsequently, the entire surface was ground and polished so as to obtain a wafer placement surface having a total thickness of 25 mm, an insulating layer thickness of 1.0 mm, and a surface roughness Ra of 0.4 μm.

Flat-bottom holes each having a bore diameter ϕ of 5.5 mm and reaching the connection member were formed at terminal positions from the back surface side of the ceramic substrate.

(6) Connection of External Metallic Terminals

Tungsten-made and Kovar-made intermediate members each having a diameter of 5 mm and a thickness of 1 mm and a circular columnar Ni-made power supply terminal having a diameter of 5 mm and a length of 30 mm were placed on the exposed bottom surface of the connection member through a brazing material. Brazing with the Au—Ni-based brazing material was performed at 1050° C. in a vacuum furnace, and an electrode-embedded member was thereby completed.

Example 2

Next, an example in which an electrode-embedded member 1 similar to that in Example 1 was manufactured using the powder hot-pressing method will be described as Example 2.

(1) A raw material powder mixture containing 95% by mass of aluminum nitride powder and 5% by mass of yttrium oxide powder was charged into a closed-end carbon mold and pressed uniaxially to produce a disk-shaped green compact A.

(i) Disk-Shaped Green Compact a (a Plate that Becomes the Insulating Layer after Firing)

Diameter: 340 mm, thickness: 5 mm (ii) The same high-frequency electrode as that in Example 1 was placed at a prescribed position on the disk-shaped green compact A.

(iii) Connection Member

The same connection member as that in Example 1 was disposed at a prescribed position on the high-frequency electrode.

(iv) Buffer Member

The same buffer member as that in Example 1 was disposed so as to cover the connection member on the high-frequency electrode.

(2) The same raw material powder mixture as above was further charged into the closed-end carbon mold and pressed uniaxially to produce a disk-shaped green compact B.

Diameter: 340 mm, thickness: 10 mm (v) The heater electrode was placed on the disk-shaped green compact B.

(vi) Additional Connection Member

The same additional connection member as that in Example 1 was placed at a prescribed position on the heater electrode.

(vii) Additional Buffer Member

The same additional buffer member as that in Example 1 was placed so as to cover the additional connection member on the heater electrode.

(3) The same raw material powder mixture as above was further charged into the closed-end carbon mold and pressed uniaxially to produce a disk-shaped green compact C.

(viii) Disk-Shaped Green Compact C (a Plate that Becomes a Base after Firing)

Diameter: 340 mm, thickness: 20 mm (4) Hot Press Firing

Hot press firing was performed at a pressure of 10 MPa and a firing temperature of 1800° C. for a firing time of 2 hours.

(5) Post-Firing Machining

Subsequently, the entire surface was ground and polished so as to obtain a wafer placement surface having a total thickness of 25 mm, an insulating layer thickness of 1.0 mm, and a surface roughness Ra of 0.4 μm.

Flat-bottom holes each having a bore diameter ϕ of 5.5 mm and reaching the connection member were formed at terminal positions from the back side of the ceramic substrate.

(6) Connection of External Metallic Terminal

Tungsten-made and Kovar-made intermediate members each having a diameter of 5 mm and a thickness of 1 mm and a circular columnar Ni-made power supply terminal having a diameter of 5 mm and a length of 30 mm were placed on the exposed bottom surface of the connection member through a brazing material. Brazing with the Au—Ni-based brazing material was performed at 1050° C. in a vacuum furnace, and an electrode-embedded member was thereby completed.

Example 3

Next, another example in which an electrode-embedded member 1 was manufactured using the green body pressing method will be described as Example 3.

The same process as in Example 1 was repeated except that, as each of the buffer members, a recessed member was prepared by mixing AlN raw material powder and tungsten (W) powder at a volume ratio of 70%:30%, molding the powder mixture into a recessed disk having a diameter of 12 mm and a thickness of 1.5 mm and having a counterbore hole (recess) extending inward from one side of the disk and having a diameter of 8 mm and a depth of 0.5 mm.

Example 4

Next, another example in which an electrode-embedded member 1 was manufactured using the green body pressing method will be described as Example 4.

The same process as in Example 1 was repeated except that, as each of the buffer members, a recessed member was prepared by mixing AlN raw material powder and tungsten (W) powder at a volume ratio of 90%:10%, molding the powder mixture into a recessed disk having a diameter of 12 mm and a thickness of 1.5 mm and having a counterbore hole (recess) extending inward from one side of the disk and having a diameter of 8 mm and a depth of 0.5 mm.

Example 5

Next, another example in which an electrode-embedded member 1 was manufactured using the green body pressing method will be described as Example 5.

The same process as in Example 1 was repeated except that each of the connection members was a molybdenum bulk body with a diameter of 8 mm and a thickness of 0.5 mm and that, as each of the buffer members, a recessed member was prepared by mixing AlN raw material powder and molybdenum (Mo) powder at a volume ratio of 70%:30%, molding the powder mixture into a recessed disk having a diameter of 12 mm and a thickness of 1.5 mm and having a counterbore hole (recess) extending inward from one side of the disk and having a diameter of 8 mm and a depth of 0.5 mm.

Comparative Example

Next, a Comparative Example to be compared with the Examples will be described.

In the Comparative Example, an electrode-embedded member in which the buffer members used in Example 1 were not disposed around the respective connection members and which therefore contained no buffer member was manufactured by a conventional method.

(Evaluation)

The electrode-embedded members manufactured in Examples 1 to 5 and the Comparative Example were used for a semiconductor manufacturing process with a process temperature of 600° C.

After elapse of three months after the start of use, cross sections of the terminal portions were observed under an SEM. In Examples 1 to 5, no crack was found. However, in the Comparative Example, the propagation of a crack from an edge of the connection member toward the surface of the electrode-embedded member was found.

A. EMBODIMENTS

Figure 8:
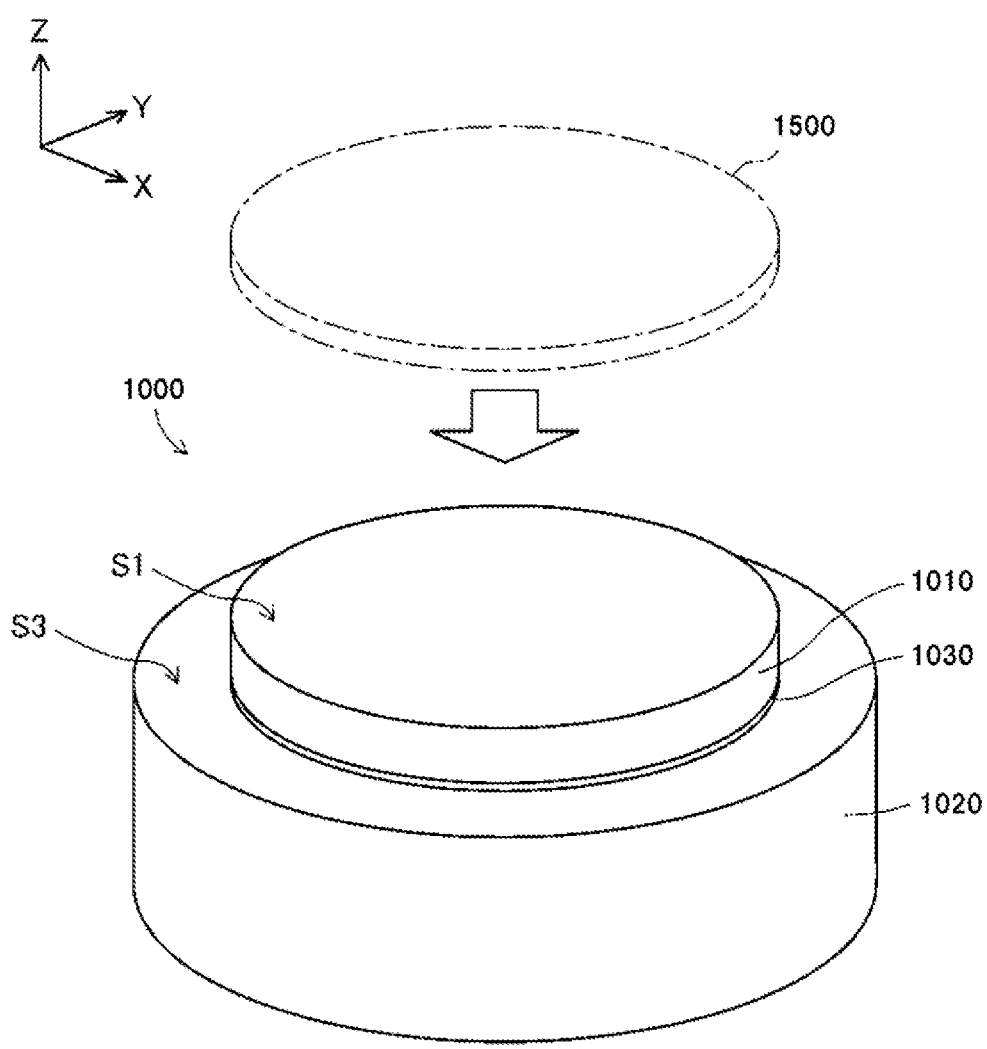
FIG. 8 is a perspective view schematically showing the appearance of an electrostatic chuck 1000 in the present embodiment.
Figure 9:
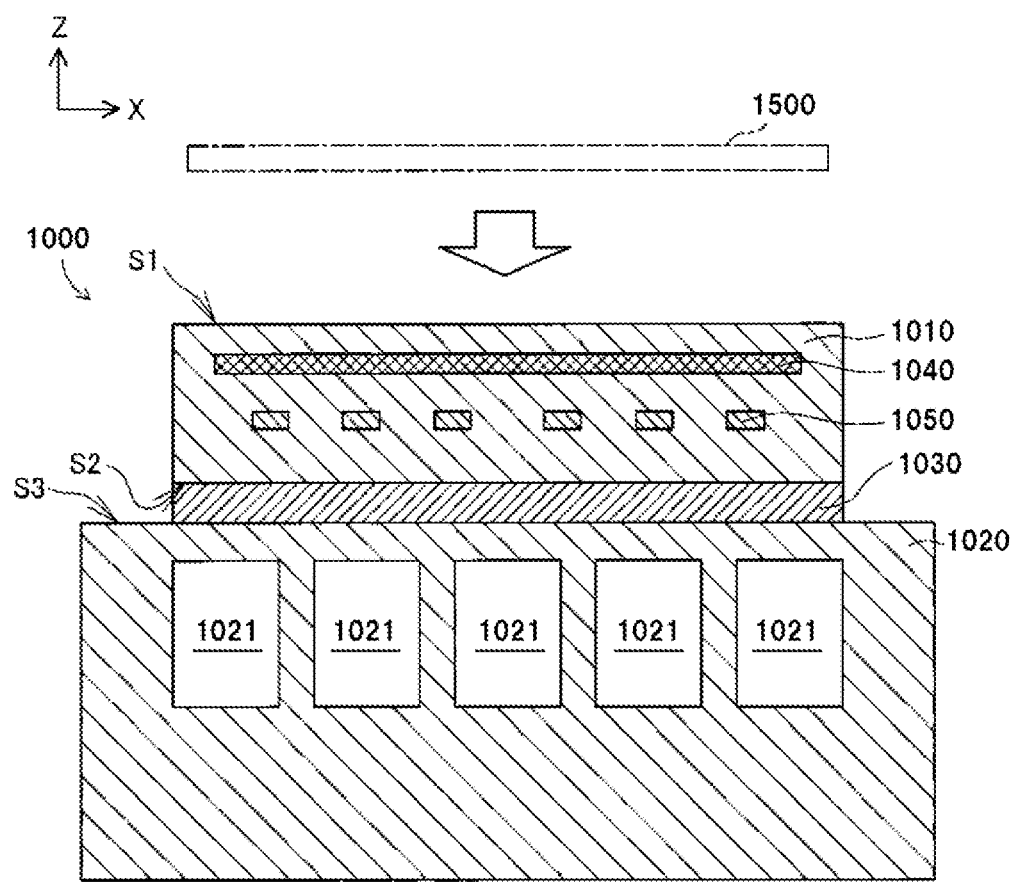
FIG. 9 is an explanatory view schematically showing an XZ cross-sectional structure of the electrostatic chuck 1000 in the present embodiment.

A-1. Structure of Electrostatic Chuck 1000:

FIG. 8 is a perspective view schematically showing the appearance of an electrostatic chuck 1000 in the present embodiment, and FIG. 9 is an explanatory view schematically showing an XZ cross-sectional structure of the electrostatic chuck 1000 in the present embodiment. In FIGS. 8 and 9, mutually orthogonal XYZ axes are shown in order to specify the directions. In the present description, for the sake of convenience, the positive Z-axis direction is referred to as an upward direction, and the negative Z-axis direction is referred to as a downward direction. However, in practice, the electrostatic chuck 1000 may be disposed in an orientation different from the above orientation.

The electrostatic chuck 1000 is an apparatus for attracting and holding an object (e.g., a wafer 1500) by electrostatic attraction and is used to fix the wafer 1500 in, for example, a vacuum chamber of a semiconductor manufacturing apparatus. The electrostatic chuck 1000 includes a ceramic plate 1010 and a base plate 1020 arranged in a prescribed arrangement direction (the vertical direction (the Z axis direction) in the present embodiment). The ceramic plate 1010 and the base plate 1020 are disposed such that the lower surface of the ceramic plate 1010 (hereinafter referred to as a "ceramic-side bonding surface S2") and the upper surface of the base plate 1020 (hereinafter referred to as a "base-side bonding surface S3") face each other in the arrangement direction. The electrostatic chuck 1000 further includes a bonding layer 1030 disposed between the ceramic-side bonding surface S2 of the ceramic plate 1010 and the base-side bonding surface S3 of the base plate 1020.

The ceramic plate 1010 is, for example, a circular flat plate-shaped member and formed of a ceramic material. The diameter of the ceramic plate 1010 is, for example, about 50 mm to about 500 mm (generally about 200 mm to about 350 mm), and the thickness of the ceramic plate 1010 is, for example, about 2 mm to about 10 mm.

Various ceramic materials can be used as the material forming the ceramic plate 1010. From the viewpoint of strength, wear resistance, plasma resistance, relations with the material forming the base plate 1020 described later, etc., a ceramic material containing, as a main component, aluminum oxide (alumina, $Al_2O_3$) or aluminum nitride (AlN), for example, is preferably used. The main component as used herein means a component with the highest content (percent by weight).

A pair of internal electrodes 1040 formed of a conductive material (such as tungsten or molybdenum) is disposed inside the ceramic plate 1010. When a voltage is applied to the pair of internal electrodes 1040 from a power source (not shown), electrostatic attraction is generated. By virtue of the electrostatic attraction, the wafer 1500 is attracted and fixed to the upper surface of the ceramic plate 1010 (herein after referred to as an "attracting surface S1").

A heater 1050 formed from a resistance heating element made of a conductive material (such as tungsten or molybdenum) is disposed inside the ceramic plate 1010. When a voltage is applied to the heater 1050 from a power source (not shown), the heater 1050 generates heat. The ceramic plate 1010 is thereby heated, and the wafer 1500 held on the attracting surface S1 of the ceramic plate 1010 is heated. In this manner, the temperature of the wafer 1500 can be controlled. To heat the attracting surface S1 of the ceramic plate 1010 as uniform as possible, the heater 1050 is disposed, for example, approximately concentrically as viewed in the Z direction.

The base plate 1020 is, for example, a circular flat plate-shaped member having the same diameter as the ceramic plate 1010 or a larger diameter than the ceramic plate 1010 and is made of a composite material formed of a ceramic material and an aluminum alloy. The diameter of the base plate 1020 is, for example, about 220 mm to about 550 mm (generally about 220 mm to about 350 mm), and the thickness of the base plate 1020 is, for example, about 20 mm to about 40 mm.

Metals and various composite materials can be used as the material forming the base plate 1020. The metal used is preferably Al (aluminum) or Ti (titanium). The composite material used is preferably a composite material prepared by impregnating a porous ceramic material containing silicon carbide (SiC) as a main component with a molten aluminum alloy containing aluminum as a main component under pressure. The aluminum alloy contained in the composite material may contain Si (silicon) or Mg (magnesium) or may contain other elements so long as they do not affect properties, etc.

A coolant channel 1021 is formed inside the base plate 1020. When a coolant (such as a fluorine-based inert liquid or water) flows through the coolant channel 1021, the base plate 1020 is cooled. The ceramic plate 1010 is cooled by heat transfer between the base plate 1020 and the ceramic plate 1010 through the bonding layer 1030, and the wafer 1500 held on the attracting surface S1 of the ceramic plate 1010 is thereby cooled. In this manner, the temperature of the wafer 1500 can be controlled.

The bonding layer 1030 bonds the ceramic plate 1010 to the base plate 1020. The thickness of the bonding layer 1030 is, for example, about 0.03 mm to about 1 mm.

Figure 10:
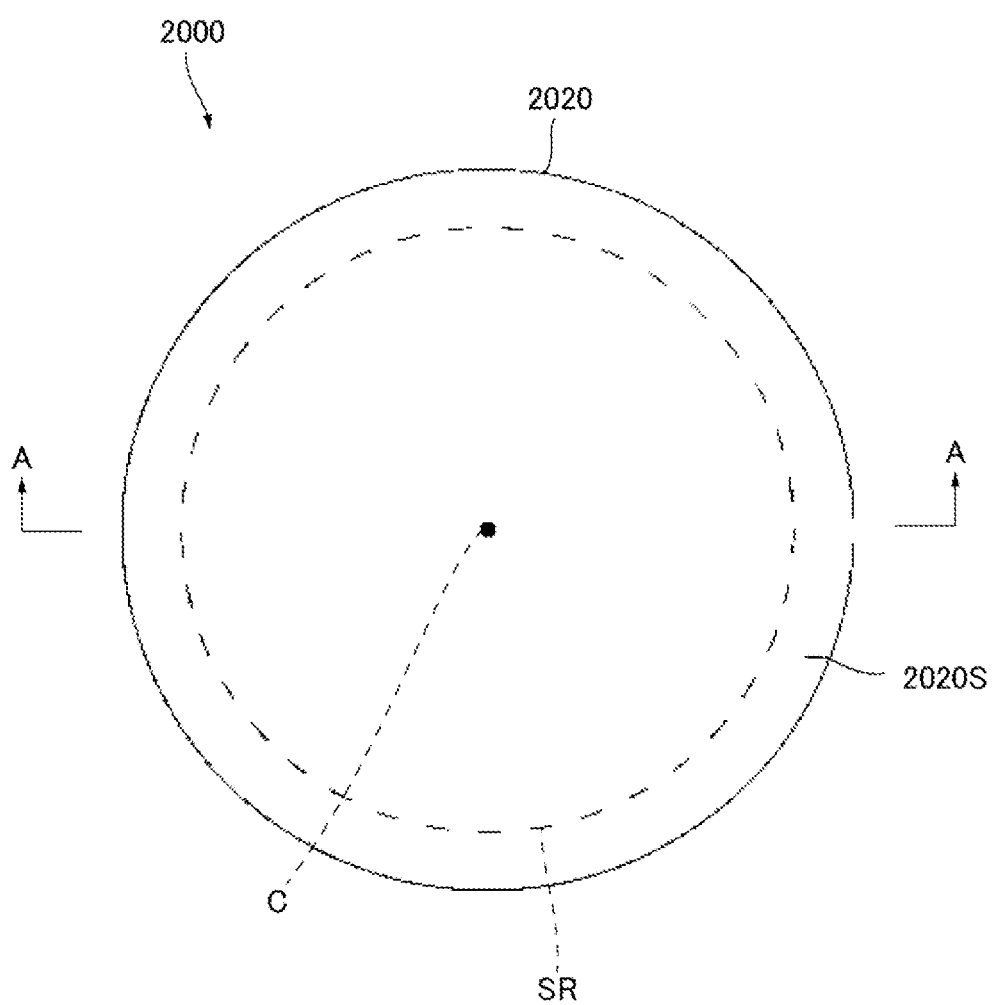
FIG. 10 is a plan view of a ceramic structural body.
Figure 11:
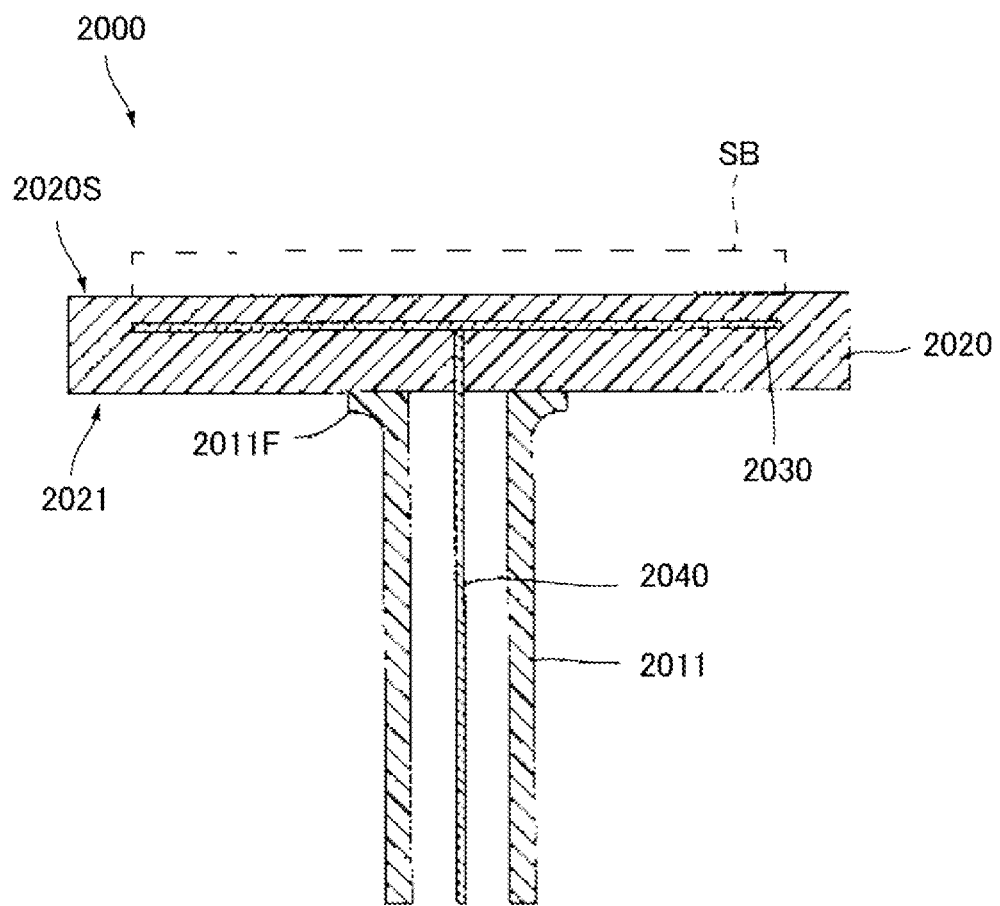
FIG. 11 is a cross-sectional view along line A-A in FIG. 10.

A-2. Structure of Ceramic Heater 2000:

FIG. 10 is a plan view of a ceramic heater 2000 in an Example. FIG. 11 is a cross-sectional view taken along line A-A in FIG. 10.

As shown in FIG. 10, the ceramic heater 2000 used as a ceramic structural body in the Example includes a base member 2020 that is, for example, a plate-shaped ceramic substrate formed from an AlN ceramic sintered body containing $Y_2O_3$.

The base member 2020 has a disk shape. One surface of the base member 2020 is a substrate placement surface 2020S. In addition to the aluminum nitride described above, silicon nitride, SiAlON, silicon carbide, boron nitride, alumina, etc. can be used as the material of the ceramic sintered body forming the base member 2020.

As shown in FIG. 11, a substrate SB (indicated by a broken line in FIG. 11) is placed so as to be in contact with the substrate placement surface 2020S.

A substrate placement region SR is provided inside a circle whose center is located at the center point C of the substrate placement surface 2020S.

A shaft 2011 serving as a support is a cylindrical hollow shaft member. The shaft 2011 is formed from a ceramic sintered body made of alumina ($Al_2O_3$), aluminum nitride (AlN), silicon nitride ($Si_3N_4$), etc.

A flange portion 2011F is provided at a first axial end of the shaft 2011. The shaft 2011 is attached at its first end having the flange portion 2011F formed thereat to the lower surface 2021 of the base member 2020 that is its one principal surface. For example, the shaft 2011 is attached to the base member 2020 through solid-phase bonding between the lower surface 2021 of the base member 2020 and the surface of the flange portion 2011F.

An electrode 2030 formed as a metal electrode layer is a heat-generating resistor embedded in the base member 2020. A power supply rod 2040 serving as a metal terminal is electrically connected at its first end to the electrode 2030. The power supply rod 2040 is electrically connected at its second end to a power source (not shown). Specifically, electric power from the power source is supplied to the electrode 2030 through the power supply rod 2040. The electrode 2030 is a heating element that generates heat when the electric power is supplied, and the base member 2020 as a whole is thereby heated. Although not illustrated, a plurality of power supply rods 2040 are electrically connected to the electrode 2030.

The electrode 2030 is embedded so as to extend over the entire substrate placement region SR as viewed in a direction perpendicular to the substrate placement surface 2020S. The electrode 2030 has, for example, a mesh shape as viewed in a direction perpendicular to the substrate placement surface 2020S. The electrode 2030 is formed of, for example, a metal material such as molybdenum.

The power supply rod 2040 is formed into the shape of a column which extends in the axial direction of the shaft 2011 within the hollow portion of the shaft 2011 and whose one end portion extends into the base member 2020.

Nickel (Ni), for example, can be used as the material of the power supply rod 2040. The power supply rod 2040 may have any columnar shape such as a polygonal columnar shape or a truncated conical shape.

REFERENCE SIGNS LIST 1 electrode-embedded member
2, 2A substrate
3 internal electrode
4 connection member
4a, 4b principal surface of connection member
4d, 4e edge of connection member
5 terminal hole
6 terminal (external metallic terminal)
7 brazing portion
7a, 7b intermediate member
10, 10A buffer member
20 first debindered green body
21 second debindered green body

The invention claimed is:

1. An electrode-embedded member comprising:
a ceramic-made substrate;
an electrode embedded in the substrate;
a connection member containing at least one of tungsten and molybdenum and having a first principal surface, a second principal surface, a side surface that connects the first principal surface to the second principal surface, and an edge formed by the second principal surface and the side surface along an entire circumference of the second principal surface, the connection member being embedded in the substrate in a state in which the first principal surface faces the electrode and the connection member is electrically connected to the electrode; and
a hole portion extending from an outer surface of the substrate to the second principal surface of the connection member,
the electrode-embedded member being characterized in that
a buffer member is embedded in the substrate,
the buffer member contains at least a ceramic material and at least one of tungsten and molybdenum, and
the buffer member covers at least part of the edge of the connection member.

2. The electrode-embedded member according to claim 1, wherein the buffer member contains at least a ceramic material forming the substrate and a conductive material containing at least one of tungsten and molybdenum as a constituent element.

3. The electrode-embedded member according to claim 1, further comprising an external metallic terminal connected to the connection member with part of the external metallic terminal inserted into the hole portion.

4. The electrode-embedded member according to claim 3, wherein the buffer member covers an entire circumference of the edge of the connection member.

5. The electrode-embedded member according to claim 1, wherein the buffer member covers an entire circumference of the edge of the connection member.

6. A method for manufacturing the electrode-embedded member according to claim 4, the method comprising:
- a green body forming step of forming a ceramic-made first green body and a ceramic-made second green body;
- an electrode placing step of placing the electrode and the connection member on the first green body;
- a buffer member step of covering at least part of the edge of the connection member with the buffer member that is formed from a mixture of at least a ceramic material forming the first green body and the second green body and a conductive material containing at least one of tungsten and molybdenum as a constituent element;
- a second green body placing step of placing the second green body on the first green body, the electrode, the connection member, and the buffer member; and
- a sintering step of pressing and firing the first green body and the second green body with the electrode, the connection member, and the buffer member sandwiched between the first green body and the second green body.

7. A method for manufacturing the electrode-embedded member according to claim 1, the method comprising:
- a green body forming step of forming a ceramic-made first green body and a ceramic-made second green body;
- an electrode placing step of placing the electrode and the connection member on the first green body;
- a buffer member step of covering at least part of the edge of the connection member with the buffer member that is formed from a mixture of at least a ceramic material forming the first green body and the second green body and a conductive material containing at least one of tungsten and molybdenum as a constituent element;
- a second green body placing step of placing the second green body on the first green body, the electrode, the connection member, and the buffer member; and
- a sintering step of pressing and firing the first green body and the second green body with the electrode, the connection member, and the buffer member sandwiched between the first green body and the second green body.

8. A method for manufacturing the electrode-embedded member according to claim 4, the method comprising:
- a first green compact forming step of forming a first green compact by charging a ceramic raw material powder into a closed-end cylindrical mold having an opening and pressing the ceramic raw material powder;
- an electrode placing step of disposing the electrode and the connection member in the closed-end cylindrical mold so as to be located on an opening side of the closed-end cylindrical mold with respect to the first green compact;
- a buffer member step of covering at least part of the edge of the connection member with the buffer member that is formed from a mixture of at least a ceramic material forming the raw material powder and a conductive material containing at least one of tungsten and molybdenum as a constituent element;
- a second green compact forming step of forming a second green compact including the first green compact by charging the raw material powder into the opening side of the closed-end cylindrical mold so as to be placed on the first green compact, the electrode, and the buffer member and then pressing the raw material powder; and
- a sintering step of pressing and firing the second green compact including, embedded therein, the electrode, the connection member, and the buffer member.

9. A method for manufacturing the electrode-embedded member according to claim 1, the method comprising:
- a first green compact forming step of forming a first green compact by charging a ceramic raw material powder into a closed-end cylindrical mold having an opening and pressing the ceramic raw material powder;
- an electrode placing step of disposing the electrode and the connection member in the closed-end cylindrical mold so as to be located on an opening side of the closed-end cylindrical mold with respect to the first green compact;
- a buffer member step of covering at least part of the edge of the connection member with the buffer member that is formed from a mixture of at least a ceramic material forming the raw material powder and a conductive material containing at least one of tungsten and molybdenum as a constituent element;
- a second green compact forming step of forming a second green compact including the first green compact by charging the raw material powder into the opening side of the closed-end cylindrical mold so as to be placed on the first green compact, the electrode, and the buffer member and then pressing the raw material powder; and
- a sintering step of pressing and firing the second green compact including, embedded therein, the electrode, the connection member, and the buffer member.

10. An electrostatic chuck characterized in that the electrode-embedded member according to claim 1 is used as the electrostatic chuck.

11. A ceramic heater characterized in that the electrode-embedded member according to claim 1 is used as the ceramic heater.

* * * * *